(12) United States Patent
Feugnet et al.

(10) Patent No.: US 6,961,360 B2
(45) Date of Patent: Nov. 1, 2005

(54) PUMPED LASER AND OPTIMIZED LASING MEDIUM

(75) Inventors: Gilles Feugnet, Les Ulis (FR); Eric L Allier, Palaiseau (FR); Christian L Arat, Paris (FR); Jean-Paul Pocholle, La Norville (FR); Didier Rolly, Marcoussis (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/069,599

(22) PCT Filed: Jun. 12, 2001

(86) PCT No.: PCT/FR01/01813

§ 371 (c)(1), (2), (4) Date: Feb. 28, 2002

(87) PCT Pub. No.: WO02/01683

PCT Pub. Date: Jan. 3, 2002

(65) Prior Publication Data

US 2002/0122448 A1 Sep. 5, 2002

(30) Foreign Application Priority Data

Jun. 30, 2000 (FR) .................................. 00 08519

(51) Int. Cl.⁷ .............................................. H01S 3/93
(52) U.S. Cl. ............................. 372/72; 372/6; 372/75
(58) Field of Search ................................ 372/6, 72, 75

(56) References Cited

U.S. PATENT DOCUMENTS

| 5,055,422 A | 10/1991 | Weisbuch et al. |
| 5,077,750 A | 12/1991 | Pocholle et al. |
| 5,086,433 A | 2/1992 | Pocholle et al. |
| 5,088,096 A | 2/1992 | Pocholle et al. |
| 5,105,428 A | 4/1992 | Pocholle et al. |
| 5,173,910 A | 12/1992 | Pocholle et al. |
| 5,311,540 A | 5/1994 | Pocholle et al. |
| 5,375,131 A | 12/1994 | Pocholle et al. |
| 5,615,042 A | 3/1997 | Delacourt et al. |
| 5,877,890 A | 3/1999 | Snitzer |
| 6,418,156 B1 * | 7/2002 | Peressini ..................... 372/70 |
| 6,630,658 B1 * | 10/2003 | Bohnert et al. ........ 250/227.14 |
| 6,636,678 B1 * | 10/2003 | Bendett et al. ............. 385/132 |

FOREIGN PATENT DOCUMENTS

EP          0 570 743          11/1993

OTHER PUBLICATIONS

G. Feugnet et al.: "High-effeciency TEM00 Nd:YVO4 Laser Longitudinally pumped by a high power array" Optics Letters, US, Optical Society of America, Washington, vol. 20, no. 2, pp. 157-159 Jan. 15, 1995.

*Primary Examiner*—Minsun Oh Harvey
*Assistant Examiner*—Cornelius H. Jackson
(74) *Attorney, Agent, or Firm*—Oblon, Spivak, McClelland, Maier & Neustadt, P.C.

(57) ABSTRACT

A longitudinally pumped laser including one or more active lasing media arranged in an optical laser cavity and at least one pumping device emitting at least one pumping beam toward the at least one active lasing medium. The pumped beam or beams is coupled with the active medium. At least one of the active lasing media includes one or more non-homogeneously doped zones, and the dimension of the doped zones and/or the distribution of the dopants is chosen on the basis of the desired transverse mode of the laser cavity. Such a laser can be used as an amplifier.

27 Claims, 4 Drawing Sheets

PUMPED LASER AND OPTIMIZED LASING MEDIUM

BACKGROUND OF THE INVENTION

1. Field of the Invention

It can be applied more particularly to diode-pumped lasers, for example a diode-pumped laser comprising a simple coupling optical system It can also be used as an amplifier of laser type beams.

2. Discussion of the Background

The pumping geometry of lamp-pumped lasers is almost exclusively what is called a transverse pumping geometry, i.e. the direction of propagation of the beam in the optical cavity and the greatest dimension of the lamps are parallel. The light emitted by the lamps penetrates the lasing medium through its transverse faces.

With laser diodes, whose emission is more directional than that of a lamp, it is possible to envisage another pumping geometry known as longitudinal pumping geometry. In this case, the pump beam and the laser beam get propagated in directions close to each other, and the efficiency of the laser is promoted when these two beans get superimposed with similar sections in the lasing medium. It is also possible to encourage operation in the fundamental $TEM_{00}$ mode of the stable cavity when the dimension of the pumped beam is close to that of the fundamental mode.

The fundamental laser beams of stable cavities have circular sections or more or less elliptical sections that do not necessarily coincide with the shape of the emissive surfaces of the laser diodes. To obtain the superimposition of the pumped laser with the beam of the laser, there are known ways of using an optical system for the focusing or reshaping of the emitted light.

For example, the making of a longitudinally pumped laser requires the use of an optical system that focuses the light emitted by one or more high-power laser diode arrays.

Figure 1:
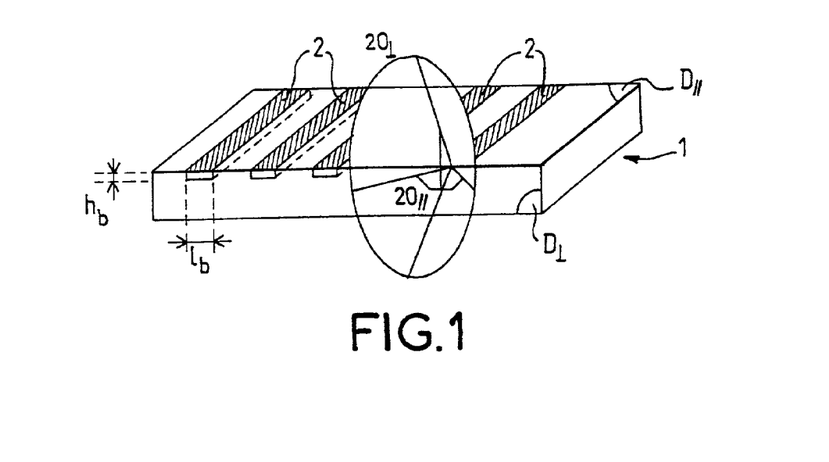
FIG. 1 shows an exemplary prior art laser diode.

FIG. 1 shows an exemplary laser diode array 1 comprising several elementary laser diodes positioned side by side. Each of the laser diodes has an emissive zone whose width $l_b$ varies from a few microns to some hundreds of microns for example, and a height $h_b$ of about one micron. The extent of the emission zone proves therefore to be highly dissymmetrical. Indeed diode arrays generally have a size of about one cm and a divergence $\theta_{//}$ of about 10° in the plane $D_{//}$ parallel to the junction. In the plane $D_\perp$ perpendicular to the junction the size is in the range of one $\mu m$ and the divergence $\theta\perp$ is 50°. Thus, the extent of an array is about 2000 times greater along the plane $D_{//}$ than it is along the plane $D_\perp$. The high value of the extent in the plane $D_{//}$ and the great dissymmetry between $D_{//}$ and $D_\perp$ make it difficult to design optical systems for the focusing of light emitted with the active lasing medium.

Given the present-day characteristics of high-power arrays, the light emitted may be focused on a spot with diameter of about 1 to 2 mm with efficiency values of at least 70% (the ratio between the mean power transmitted and the mean power emitted).

At output of an optical system such as this, the light is highly divergent and this is inconvenient because:
  the oscillation threshold of the laser increases with the volume in which the pump energy is deposited, and,
  a multimode operation may be induced if this volume is greater than the volume taken up by the fundamental mode of the cavity.

There are known ways to reduce these phenomena by using highly doped crystals: the volume needed to absorb the pump power diminishes as the absorption coefficient increases. This approach however has certain drawbacks, for example:
  it fosters the appearance of aberrations, strains and birefringence due to thermal causes: correcting these defects becomes difficult and the $TEM_{00}$ mode of operation is no longer possible,
  it reduces the amount of pump energy that can be deposited without reaching the damage threshold of the material, and
  it limits the choice of the laser materials There also exist known ways in the prior art of using non-homogeneously doped lasing media.

For example, certain lasers having a transverse pumping geometry using non-uniformly doped media in order to select the desired mode.

In other applications, the geometry of the longitudinally pumped laser arrays is such that the section of the array is very small as compared with the length using the guidance of the pump light by total reflection on the periphery of the array. However, mode selection by doping is not achieved. An exemplary embodiment is given in the references E. C. Honea and al, Optics Letters, p 1203, OSA 1998 or E. C. Honea and al, Optics Letters, p 154, OSA 1999.

SUMMARY OF THE INVENTION

The idea of the invention consists especially in using a non-homogeneously doped material as an active lasing medium, this material comprising one or more zones in which the distribution of the dopants is chosen, in particular, according to a favored mode of the laser, such as the desired transverse mode.

It relies also on the association of a simple optical focusing system that comprehensively treats the light source coming from the diode with the non-uniformly doped active lasing medium.

The invention relates to a longitudinally pumped laser comprising one or more active lasing media arranged in an optical cavity and at least one pumping means emitting at least one pumping beam toward the active lasing medium or media, means for the coupling of the pumped beam or beams with the active medium. The invention is characterized in that at least one of the active lasing media comprises one or more non-homogeneously doped zones and in that the dimension of said doped zones and/or the distribution of the dopants is chosen on the basis of the desired transverse mode of the laser cavity.

The doped zone is positioned for example substantially centrally in the active medium, its dimensions are adapted to the fundamental mode of the laser cavity or to the transverse mode and the non-doped peripheral zone has dimensions adapted to the coupling means.

The section $s_d$ of the input face of the doped zone that receives the pump beam is for example smaller than or equal to the section $s_m$ of the fundamental mode of the cavity.

The section $s_d$ of the input face of the doped zone that receives the pump beam may be at least greater than the section $s_m$ of the fundamental mode of the cavity, the laser cavity comprising a selection device.

According to another embodiment, the active lasing medium comprises a non-doped central zone surrounded by a doped peripheral zone.

The doped zone has, for example, a parallelepiped or circular or elliptical shape.

The one or more pumping means may comprise one or more diode arrays and the coupling means may consist of a light concentrator adapted to receiving all the light emitted by the diode arrays.

The coupling means comprise for example at least one of the devices chosen from the following list: a refractive focusing system or a diffractive focusing system, or a system working by reflection or a system for reshaping the extent of a beam.

The distribution of the dopants in the active medium is made for example according to a gradient.

The dopants are chosen for example from among one or more of the ions of the following list: ($Nd^{3+}$, $Yb^{3+}$, $Er^{3+}$, $Ho^{3+}$, $Th^{3+}$, ...).

The face of the active medium facing the coupling means is treated so as to be anti-reflective at the pumping wavelength and reflective at the laser wavelength and the opposite face of the active medium is treated so as to be anti-reflective at the laser wavelength.

The invention also relates to a method for the manufacture of an active medium used in lasers. It is characterized in that it comprises at least one step for the making of one or more pieces of a doped matrix and a non-doped matrix so as to obtain an active medium comprising one or more zones or volumes having a dimension and/or a distribution of the dopants chosen to obtain a transverse mode of the laser cavity.

The manufacturing step may be a step of joining by gluing, molecular adhesion or again diffusion bonding.

According to another mode of manufacture, the manufacturing step is a step for preforming a step-index fiber or for preforming a fiber with a graded index of dopants.

Use of the laser having one of the characteristics mentioned here above to amplify one or more laser type beams.

The laser according to the invention has in particular the following advantages:
- the depositing of the pump light in a volume compatible with operation in the fundamental mode ($TEM_{00}$) and the favoring of this mode over the higher orders,
- the making of a simple focusing system that is independent of the structure of the laser array (pumping means) and is a potentially low-cost system;
- the overcoming of the problem of the divergence of the incident light on the lasing medium without having to use highly doped materials,
- the depositing of the pump energy in a large volume as compared with prior art lasers and the reduction, in this way, of thermally caused optical aberrations, the energy being distributed in a greater volume,
- not crossing the damage (or impairment) threshold of the laser material despite high pump power values.

BRIEF DESCRIPTION OF THE DRAWINGS

Other advantages and characteristics of the invention shall appear more clearly from the following description given by way of a non-restrictive example, with reference to the appended figures, of which.

DESCRIPTION OF THE PREFERRED EMBODIMENTS

To provide for a clearer understanding of the principle of operation of the laser according to the invention, the following description, given by way of an illustration that in no way restricts the scope of the invention, relates to a diode-pumped laser associated by means of a simple coupling optical system with a non-uniformly doped active lasing medium, in particular to favor the transverse $TEM_{00}$ mode of the laser cavity.

Figure 2:
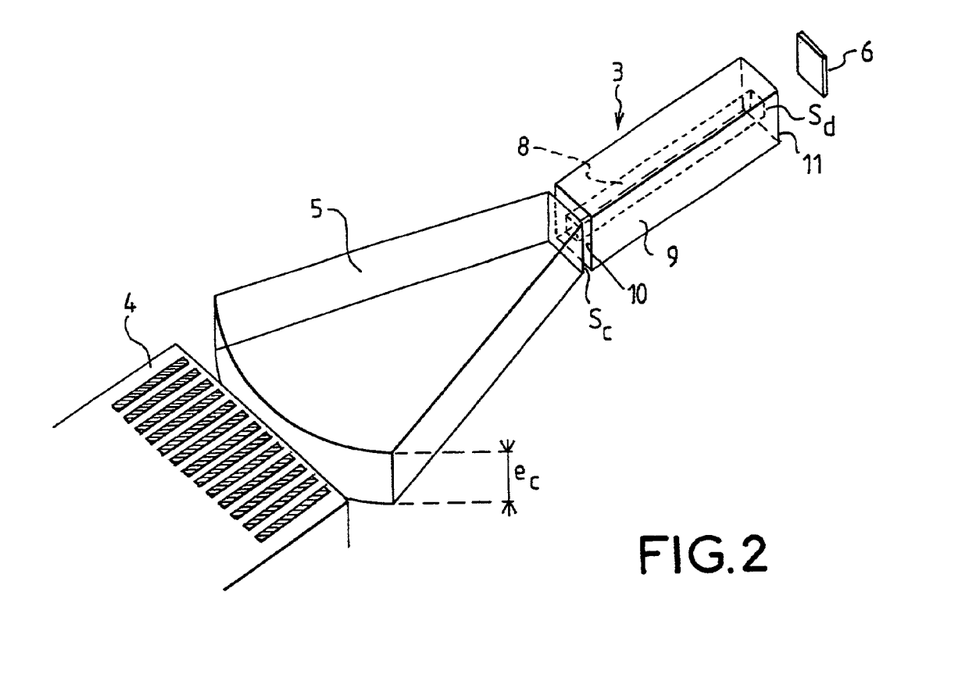
FIG. 2 is a drawing of an exemplary architecture of the laser according to the invention.

FIG. 2 shows an exemplary architecture of a laser module according to the invention. This module consists of a non-homogeneously doped active lasing medium 3 that favors a particular laser mode such as the transverse $TEM_{00}$ mode, a pump laser diode 4, means 5 for coupling the pump beam coming from the pump laser diode 4 to the active lasing medium 3. The laser cavity is closed by a mirror 6.

The mirror 6 is positioned for example in the optical axis of the laser, perpendicularly to the laser beam. It has transmission characteristics suited to optimizing the working of the laser.

Pump Laser Diode

The pump laser diode 4 may be a unitary laser diode, or an assembly of laser diodes (linear arrays, stack of linear arrays, surface emission plates etc) as described for example in FIG. 1, or again any assembly of diodes or unitary diodes. The beam emitted by such a structure is for example reshaped before it is transmitted to the active lasing medium.

Figure 4:
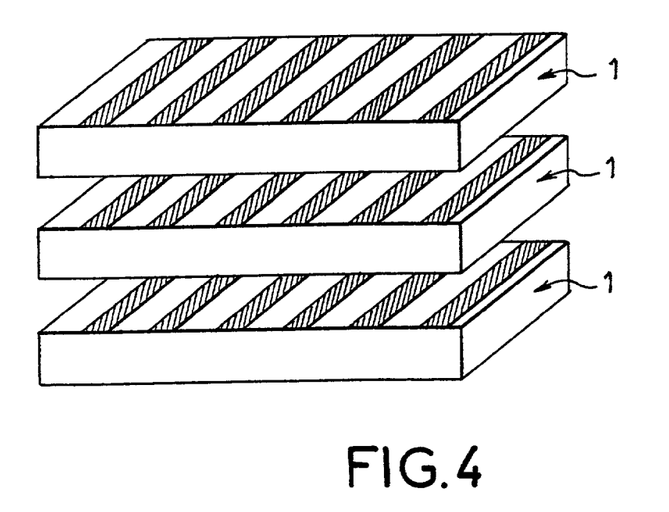
FIG. 4 shows a variant of a pump laser diode.

The laser diode may also take the form of several linear arrays positioned in such a way that the emission takes place in all three dimensions. An example of such a structure is given in FIG. 4. Such a structure may be used with or without a coupling optical system.

Coupling Means

The coupling means 5 are adapted to the type of pump laser diode used. For longitudinal type pumping, it is possible for example to use a light concentrator as described in one of the following references:

[1] "High efficiency $TEM_{00}$ $Nd:YVO_4$ laser longitudinally pumped by a high power laser diode array", SPIE Proceedings,

[2] G. Feugnet, C. Bussac, M. Schwartz, C. Larat and J. P Pocholle "Nonimaging optics III: Maximum Efficiency Light Transfer", in Opt. Lett. 20, pp 157–159, 1995.

The dimension of the concentrator 5 corresponding to the width of the laser rod in the parallel plane $D_{//}$ is equal, for example, to 1.5 mm. The thickness $e_c$ of the light concentrator is substantially constant and equal to 1.5 mm. The output face of the concentrator has a square section $s_c$ substantially equal to $(1.5*1.5)$ mm$^2$.

Active Lasing Medium

The active lasing medium 3 is formed, for example, by a composite rod comprising a doped central region 8 having a parallelepiped shape with a square section $s_d$, for example, surrounded by a non-doped peripheral region 9, namely a zone having practically no dopant and even no dopant at all.

The dopant used for the active medium is chosen, for example, from among one or more of the ions of the following list: ($Nd^{3+}$, $Yb^{3+}$, $Er^{3+}$, $Ho^{3+}$, $Th^{3+}$, ...).

The active lasing medium is, for example, a solid medium that has several laser transitions (YAG:Nd, $YVO_4$:Nd, sapphire:Ti, etc) and is known to those skilled in the art.

The doped zone 8 has a length $L_d$ substantially equal to the length $L_l$ of the active lasing medium, a section $s_d$, and a volume $V_d$ corresponding to $s_d*L_d$. The pump light is deposited or absorbed in this volume $V_d$, for example according to the scheme described in FIGS. 3a and 3b.

The doped zone 8 has dimensions adapted to the fundamental mode of the laser cavity for example. These dimensions may also be fixed so as to promote the appearance of other transverse modes. Its length is for example chosen as a function of the quantity of light to be deposited and of the absorption.

Determining the Dimensions of the Doped Zone

One way to determine the geometry and the dimensions of the non-uniformly doped zone and/or the distribution of the dopants comprises, for example, the following steps:

From the characteristics of the emissive source (the laser diode) such as its dimensions, its divergence values etc., an optical focusing system is designed. The optical focusing system is determined, for example, so that its transmission is as efficient as possible, according to criteria known to those skilled in the art. Typically, the light is focused on a spot whose section $s_l$ is some square millimeters, The section of the non-uniformly doped rod is adapted to the dimensions of the light spot.

For example, the section of the rod may be substantially square, equal to or slightly greater than that of the output face of the concentrator, For a cylindrical rod, the diameter is substantially equal to or slightly greater than the diagonal of the output face of the concentrator, The dimensions may also be chosen to take account of the positioning tolerances of the rod with respect to the concentrator and the quality of the edges of the rod.

In the case of a focusing that uses a lens, the section of the rod is adapted so that the transmission T through a fictitious aperture with identical dimensions is in the range of 100% with $$T = \int\int_{aperture\ section} I(x,y)dxdy / \int\int_\infty I(x,y)dxdy$$

where $I(x,y)$ is the distribution of the intensity at the focusing point of the light, The ratio r between the dimensions of the doped zone and those of the non-doped zone is defined in taking account of the characteristics of the pump radiation taken after the optical coupling system 5, the spectroscopic characteristics of the laser material and the technological constraints related to the making of the non-uniformly doped rod. The spectroscopic characteristics of the laser material may be recorded during preliminary tests using methods known to those skilled in the art.

The process of determining the ratio r takes place, for example, iteratively, and comprises, for example, the following steps:

during a first step a), fixing the value of the ratio r at a value $r_0$, computing (second step b)) the pump energy distribution in the rod and the associated thermal effects from this value in implementing a ray tracing program and a thermal computation program, during a third step c), designing a laser cavity whose $TEM_{00}$ mode is close to the dimensions of the doped zone, for example by means of a laser cavity computation program taking account of the thermal effects, If the $TEM_{00}$ mode determined is different or far too remote, changing the initially chosen ratio and restarting the steps a) to c). The value of the length of the laser cavity may indeed be limited for reasons of space requirement.

The different computation methods implemented in the steps described here above are known to those skilled in the art.

When determining the value of the ratio r, it is necessary to take account of the following constraints:

the influence of its value on the rod length needed to absorb the energy, it being known that the length may be limited for reasons of technology, the influence of its value on the energy absorbed per unit of length which must remain much below the optical damage threshold.

To obtain efficient discrimination between the fundamental mode of the cavity and the higher-order modes, thus favoring the $TEM_{00}$ operation, the dimensions of the doped zone are chosen as a function of the dimensions of the fundamental mode of the laser cavity.

Thus, the section $s_d$ of the doped zone is preferably smaller than or equal to the section $s_m$ of the fundamental mode of the cavity. It may also be slightly greater than or greater than the section of the fundamental mode associated with another selection device.

The section $s_m$ of the fundamental mode corresponds, for example, to the section of the laser beam taken at about 13.6% of the maximum.

The steps described with reference to a square geometry may also be applied in the case of a cylindrical geometry, in assuming, in this case, the cylindrical section of the doped zone.

The interface between the doped zone 8 and the peripheral zone 9 will be made so as to minimize the losses like to hamper or impair the operation of the laser according to techniques known to those skilled in the art.

The dimensions of the peripheral zone 9 are chosen, for example, as a function of the performance characteristics of the focusing optical system, for example the focusing spot, the divergence of the radiation after the focusing point. The section $S_{nd}$ and $S_d$ is substantially equal to the section $S_c$ of the face of the concentrator positioned before it. The length $L_{nd}$ of the non-doped zone corresponds, for example, to the length of the material or active medium forming the laser. It may correspond to the length $L_d$ of the doped zone.

Without departing from the framework of the invention, the doping may also be obtained in the form of a gradient of dopants distributed non-homogeneously in the material forming the active medium. The gradient, the distribution of the dopants as well as their nature will be determined according to the mode of operation chosen for the laser.

According to another alternative embodiment, the rod comprises a totally non-doped section at least at one of its ends. With this technique, it is possible to reduce the deformations at the ends of a rod. The contact between the non-doped sections and the non-homogeneously doped sections may be obtained by a diffusion bonding technique known to those skilled in the art.

The two external face 10, 11 of the composite rod are polished so as to guide the pump light by total or practically total reflection.

The face 10 of the composite rod that is facing the concentrator 5 is provided with a treatment that makes it anti-reflective at the pumping wavelength and totally reflective at the laser wavelength.

The opposite face 11 of the rod is treated to be anti-reflective at the laser wavelength. This face may be angle-polished so that the beam has an angle of incidence with a value close to the Brewster's value. During the mounting of the laser rod, the necessary precautions will be taken to prevent a part of the beam from getting propagated in another attached medium.

Figure 3A:
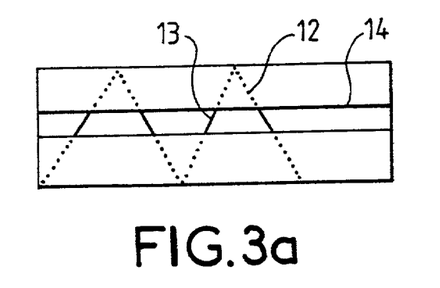
FIGS. 3a and 3b show the propagation of a light ray in the non-homogeneously doped active medium.
Figure 3B:
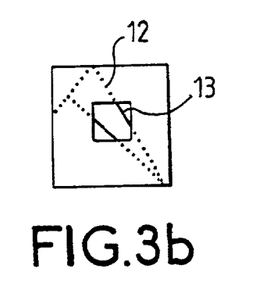

FIGS. 3a and 3b give a schematic view of an exemplary path of the pump light in the active lasing medium comprising a parallelepiped shaped central doped zone as shown in FIG. 2. During its propagation in the laser rod, the laser beam does not necessarily cross the non-doped zone at each reflection. The power of the pump is deposited solely in the central doped zone, thus favoring the $TEM_{00}$ operation. Furthermore, a structure of this kind overcomes the divergence of the pump light incident on the composite medium.

Thus, on the paths 12 shown in dotted lines, there is no absorption of light whereas on the paths 13 of the light rays shown in solid lines, the light ray is absorbed. The pump light is guided by reflection on the lateral faces of the lasing medium, by total internal reflection or by reflection on a dielectric treatment, and thus makes a zigzag path in the composite rod, in depositing the energy solely in the doped zone 8. After a sufficient number of reflections, all the power of the pump will be absorbed.

The geometry (shape and dimensions) of the non-doped zone is adapted to optimizing the number of beams that cross it while at the same time providing for guidance by total reflection.

In comparison with the highly doped structures mentioned here above, the pump power is distributed in a volume greater than that usually offered by prior art lasers. This especially reduces the aberrations, constraints and birefringence arising out of thermal causes.

According to another alternative embodiment, the active medium comprises the non-doped central zone and a dope peripheral zone. In this case, the light path will deposit energy no longer centrally but on the periphery of the composite rod, thus favoring the higher-order modes. This arrangement favors the mode usually known as the ring mode.

According to another variant, known for example in the field of what are called "double clad" fibers, described for example in the U.S. Pat. No. 4,815,079, the doped zone is off-centered with respect to the zone that guides the pump or again the guiding zone has a particular shape, for example a D shape.

With these embodiments, which consist in breaking the symmetry of the optimized medium, the number of the light phase (or propagation modes for the fibers) that never penetrate the doped zone and are not absorbed can be reduced. The absorption is thus augmented.

Method of Manufacture of a Composite Rod Forming the Emissive Medium

Several methods of manufacture may be implemented to make the active lasing medium.

One method of making a non-homogeneously doped composite rod comprises, for example, steps for assembling the doped or non-doped discrete pieces of a matrix which will have been polished before assembly.

The matrix is chosen for example from the following list: YAG, YLF, $YVO_4$, GdCOB, glass.

The different pieces are assembled according to the desired doping geometry, for example:
  by gluing, with a glue having an appropriate index, such as an optical glue known to those skilled in the art,
  by molecular bonding,
  by diffusion bonding or soldering by interdiffusion at the interfaces between the pieces. This technique especially offers higher resistance to impacts and ensures low losses at the interfaces.

Another procedure would lie in the use of techniques used in the field of optical fibers and known to those skilled in the art. The advantage of these techniques is that they involve carrying out a preform with a doped part and a non-doped part of a step-index fiber or again a preform with a gradual transition between the doped zone and the non-doped such as the preforming of a graded-index fiber. The dopants are distributed in the form of a gradient within the doped zone.

This preform may be drawn to make its diameter compatible with the dimensions needed for this application. The matrix is for example made of glass with different compositions such silicate, phosphate, fluoride or any other material to which the drawing technique is adapted.

A technique of this kind can be used especially to make circular-sectioned dope zones particularly well suited to the section of the fundamental modes of the cavity.

In the different applications of the laser assembly comprising a diode-pumped laser with a lasing medium according to the invention, different focusing means may be used To carry out the focusing function, two approaches may be singled out:
  A first approach consists in taking account of the discontinuous nature of the light source and in imaging each of the diodes of the array. Systems based on optical fiber beams, using optical injection into one or more optical fibers, refractive optical devices such as lenses, cylindrical lenses, diffractive optical devices such as holographic lenses, micro-lenses, reflection systems such as, for example, micro-mirrors, or again any combination of these systems may be used. They provide for an efficient focusing of light because the non-emissive zones are not taken into account. They are used more particularly for arrays having a small number of emitters.
  In a second approach, for example, the array is considered in its entirety without taking account of the discontinuous nature of the source. Systems based on macroscopic lenses or concentrators correspond, for example, to this approach. These systems have the advantage of being relatively simple to make. They can also be used whatever the number of emitters, and the light source is interchangeable.

Figure 5:
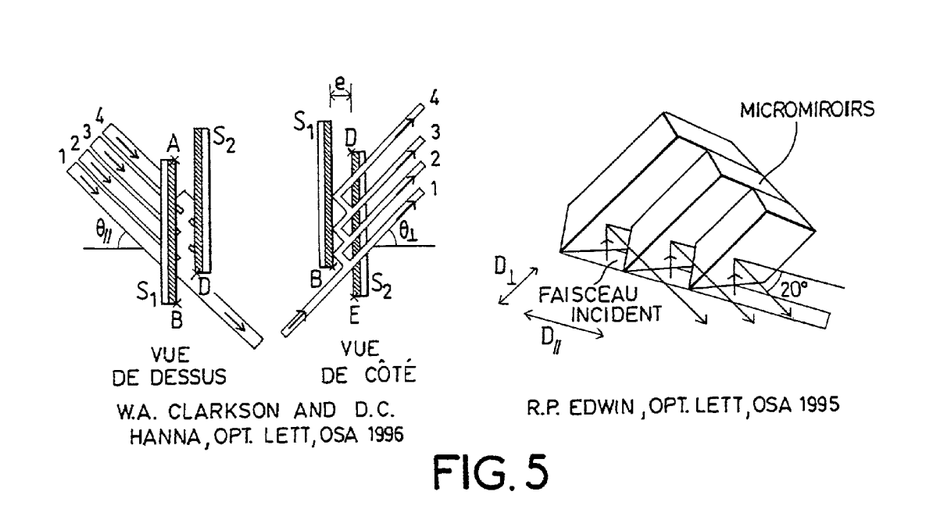
FIG. 5 illustrates two exemplary coupling optical systems known to those skilled in the art.

It is also possible to use systems for the redistribution of the extent or for reshaping the geometrical extent of the beam, for example as shown in FIG. 5.

Without departing from the framework of the invention, the laser according to the invention can also be used as an amplifier of a laser beam.

Figure 6:
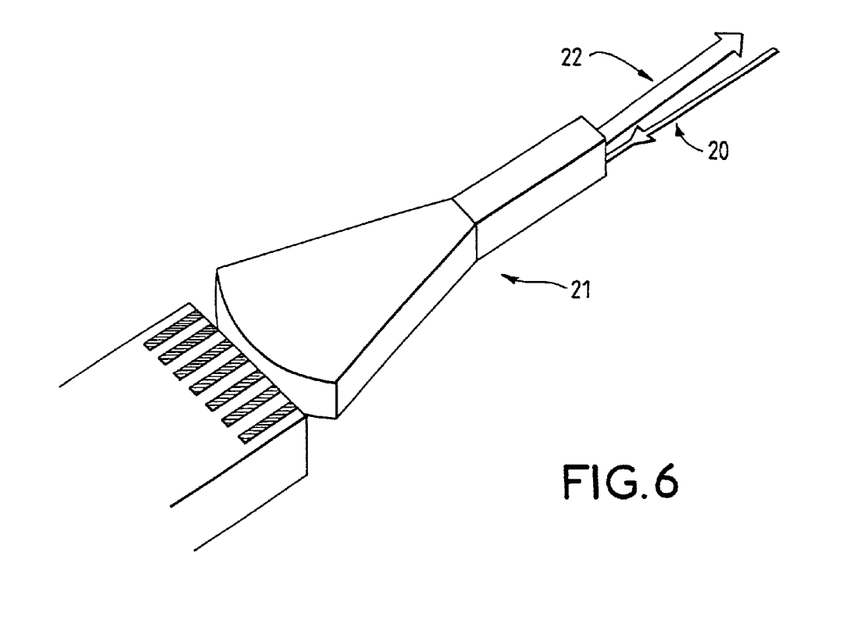
FIGS. 6 and 7 are two exemplary drawings using the laser according to the invention as an amplifier.

FIG. 6 gives a schematic view of an exemplary embodiment for the use of the structure comprising a non-uniformly doped rod as described in FIG. 2 to amplify a laser beam coming from a laser source.

The incident laser beam 20 penetrates the amplifier structure 21 at an angle different from zero and emerges therefrom for example with a direction substantially parallel to the incident direction in the form of an amplified laser beam 22.

The angle of incidence must be small so that the beam crosses the totality or at least the greater part of the doped zone. The section of the beam may be slightly smaller than the section of the doped zone.

The dimensions of the doped and non-doped zones are chosen in order to augment the energy of the incident beam while preserving the laser mode, for example, the $TEM_{00}$ mode.

With such a use it is advantageously possible to increase the energy of the beam while preserving the $TEM_{00}$ operating mode.

The amplified laser beam may be a laser beam coming from a femtosecond laser.

Figure 7:
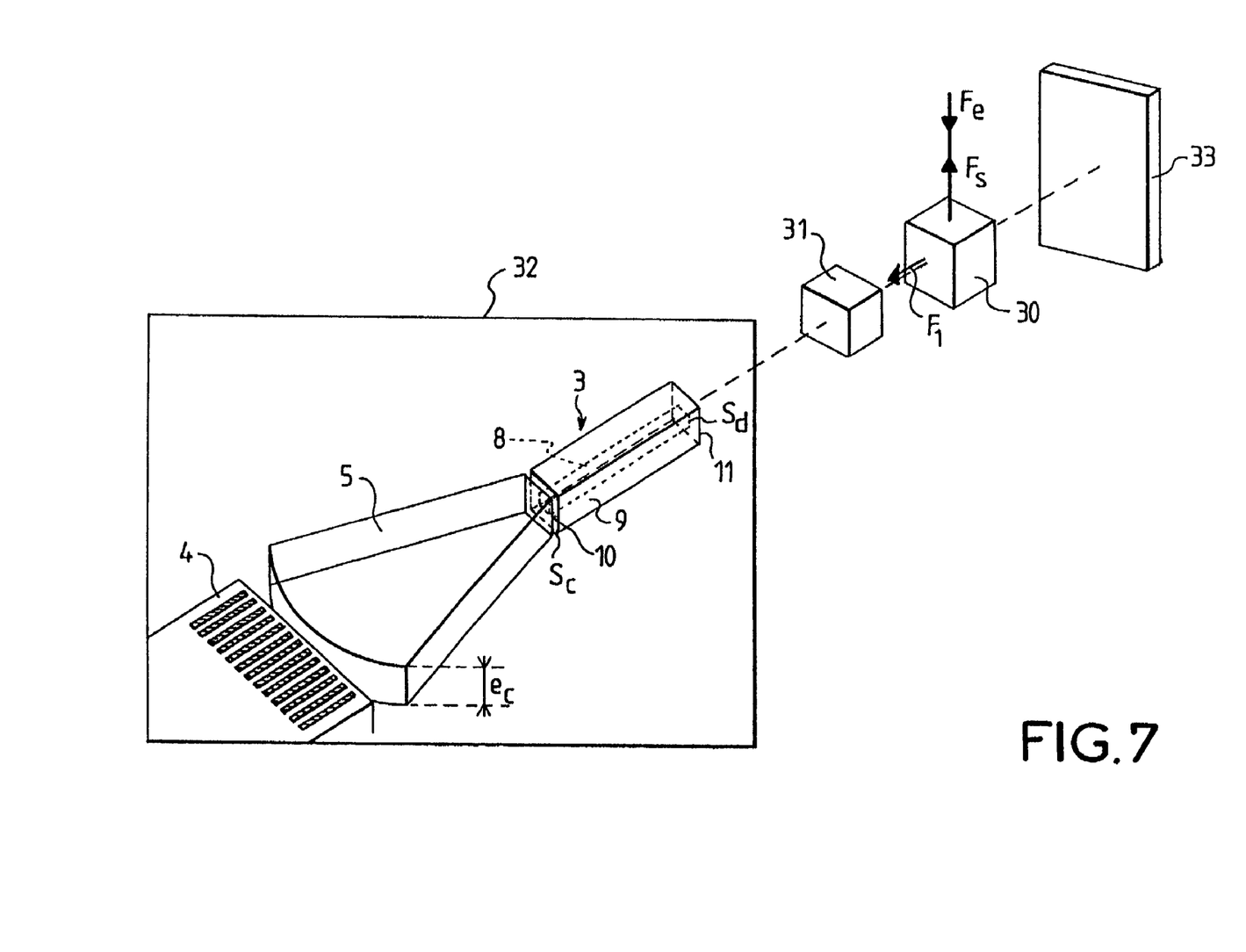

The laser structure according to the invention can also be used as a regenerative amplifier, an exemplary embodiment of which is given in FIG. 7.

In this exemplary embodiment, a laser beam $F_e$ to be amplified reaches a polarizer 30 adapted to transmitting the totality (100%) of this beam or at least the greater part of it to a device such as a Pockels cell 31 that acts especially as a phase delay plate and is known to those skilled in the art. At the entry to the Pockels cell, the beam $F_e$ possesses, for example, a linear polarization. It comes out of this cell with a circular polarization and is then transmitted to the block 32 comprising the active elements described in 2, especially the non-homogeneously doped laser medium, the mirror 6 being replaced by a laser cavity mirror 33 positioned after the polarizer. $F_1$ gets reflected on the face 10 of the non-uniformly doped rod and emerges by the face 11. It then passes through the Pockels cell 32 from where it emerges with a polarization substantially perpendicular to its initial polarization (that of the beam $F_e$). It is thus transmitted to the laser cavity mirror 33 on which it will get reflected. The beam $F_1$ is then trapped in the structure comprising the block 32 and the mirror 33, the Pockels cell enabling this beam to enter and exit. It thus makes several return trips during which it acquires energy, and is therefore amplified. The value of the gain G obtained depends especially on the number of return trips and on the structure of the non-homogeneously doped rod.

When the beam $F_1$ has acquired the desired gain, the Pockels cell is used to extract it, the output beam $F_s$ being equal to $G*F_e$.

Since the working of a Pockels cell is known to those skilled in the art, it has not been described in detail.

In general when the device is used as an amplifier of a laser beam, it comprises at least the following elements: a light source whose function especially is to excite a lasing medium, a device for coupling the light beam coming from the source to the laser medium. The lasing medium comprises at least one doped zone and one non-doped zone, having one of the characteristics stated with reference to FIG. 2 so as to augment the energy of one laser beam to be amplified.

What is claimed is:

1. Longitudinally pumped laser comprising:
   an active lasing medium arranged in an optical cavity;
   a pumping means emitting a pumping beam toward the active lasing medium;
   means for coupling the pumping beam to the active lasing medium;
   one or more non-homogeneously doped zones formed in the active lasing medium, and surrounded by a non-doped region forming a remainder of the active lasing medium and that has practically no dopant or no dopant at all, and
   wherein at least one of a dimension of said doped zones and a distribution of dopants is chosen based on a desired transverse mode of the optical cavity.

2. Laser according to claim 1, wherein the one or more doped zones is a doped zone positioned substantially centrally in the active lasing medium, dimensions of the doped zone are adapted to a fundamental mode of the optical cavity or to the transverse mode, and at least one of a non-doped peripheral zone has dimensions adapted to the coupling means.

3. Laser according to claim 1, wherein an area of an input face of the one or more doped zones that receives the pumping beam is smaller than or equal to an area of a fundamental mode of the optical cavity.

4. Laser according to claim 1, wherein an area of an input face of the one or more doped zones that receives the pumping beam is at least greater than an area of a fundamental mode of the optical cavity, the optical cavity comprising a selection device.

5. Laser according to claim 1, wherein the active lasing medium comprises a non-doped central zone surrounded by a doped peripheral zone.

6. Laser according to claim 1, wherein the one or more doped zones has a parallelepiped or circular or elliptical shape.

7. Laser according to claim 1, wherein the pumping means comprises one or more diode arrays and the coupling means includes a light concentrator for receiving all light emitted by the diode arrays.

8. Laser according to claim 1, wherein the coupling means comprises at least one of the devices chosen from the group consisting of: a refractive focusing system, a diffractive focusing system, a system working by reflection, and a system for reshaping an extent of a beam.

9. Laser according to claim 1, wherein the distribution of the dopants in the active lasing medium is made according to a gradient.

10. Laser according to claim 1, wherein in the doped zones dopants are chosen from among one or more of the ions of the group consisting of:
    $Nd^{3+}$, $Yb^{3+}$, $Er^{3+}$, $Ho^{3+}$, $Th^{3+}$.

11. Laser according to claim 1, wherein a face of the active lasing medium facing the coupling means is treated to be anti-reflective at a pumping wavelength and reflective at a laser wavelength, and an opposite face of the active medium is treated to be anti-reflective at the laser wavelength.

12. Use of the laser according to claim 1 to amplify one or more laser beams.

13. Laser according to claim 1, wherein an area of an input face of the one or more doped zones that receives the pumping beam is at least greater than an area of a fundamental mode of the optical cavity, the optical cavity comprising a selection device.

14. Method for the manufacture of an active lasing medium used in lasers, comprising:
    making one or more pieces of a doped matrix and a non-doped matrix; and
    assembling the one or more pieces to obtain an active lasing medium including one or more non-homogeneously doped zones in the active lasing medium, which are surrounded by a non-doped region forming a remainder of the active lasing medium and that has practically no dopant or no dopant at all,
    wherein at least one of a dimension of said doped zones and a distribution of dopants is chosen based on a desired transverse mode of an optical cavity.

15. Method of manufacture according to claim 14, wherein the assembling is a step of joining by gluing, molecular adhesion, or diffusion bonding.

16. Method of manufacture according to claim 14, wherein the assembling is a step for preforming a step-index fiber or for preforming a fiber with a graded index of dopants.

17. Longitudinally pumped laser comprising:
an active lasing medium arranged in an optical cavity;
a pumping means emitting a pumping beam toward the active lasing medium;
means for coupling the pumping beam with the active lasing medium; and
one or more non-homogeneously doped zones formed in the active lasing medium and surrounded by a non-doped region forming a remainder of the active lasing medium and that has practically no dopant or no dopant at all;
wherein an area of an input face of the one or more doped zones that receives the pumping beam is smaller than or equal to an area of a fundamental mode of the optical cavity.

18. Longitudinally pumped laser comprising:
an active lasing medium arranged in an optical cavity;
a pumping means emitting a pumping beam toward the active lasing medium;
means for coupling the pumping beam with the active lasing medium; and
one or more non-homogeneously doped zones formed in the active lasing medium and surrounded by a non-doped region forming a remainder of the active lasing medium and that has practically no dopant or no dopant at all;
wherein the active lasing medium comprises a non-doped central zone surrounded by a doped peripheral zone.

19. Longitudinally pumped laser comprising:
an active lasing medium arranged in an optical cavity;
a pumping means emitting a pumping beam toward the active lasing medium;
means for coupling the pumping beam with the active lasing medium; and
one or more non-homogeneously doped zones formed in the active lasing medium and surrounded by a non-doped region at at least one end of the one or more non-homogenously doped zones and forming a remainder of the active lasing medium and that has practically no dopant or no dopant at all.

20. Laser according to claim 19, wherein the one or more doped zones is a doped zone positioned substantially centrally in the active lasing medium.

21. Laser according to claim 19, wherein the one or more doped zones has a parallelepiped or circular or elliptical shape.

22. Laser according to claim 19, wherein the pumping means comprises one or more diode arrays and the coupling means includes a light concentrator for receiving all light emitted by the diode arrays.

23. Laser according to claim 19, wherein the coupling means comprises at least one of the devices chosen from the group consisting of: a refractive focusing system, a diffractive focusing system, a system working by reflection, and a system for reshaping an extent of a beam.

24. Laser according to claim 19, wherein a distribution of dopants in the doped zones of the active lasing medium is made according to a gradient.

25. Laser according to claim 19, wherein in the doped zones dopants are chosen from among one or more of the ions of the group consisting of:
$Nd^{3+}$, $Yb^{3+}$, $Er^{3+}$, $Ho^{3+}$, $Th^{3+}$.

26. Laser according to claim 19, wherein a face of the active lasing medium facing the coupling means is treated to be anti-reflective at a pumping wavelength and reflective at a laser wavelength, and an opposite face of the active medium is treated to be anti-reflective at the laser wavelength.

27. Use of the laser according to claim 19 to amplify one or more laser beams.

\* \* \* \* \*